United States Patent
Park

[11] Patent Number: 5,818,266
[45] Date of Patent: Oct. 6, 1998

[54] REFERENCE VOLTAGE GENERATOR MADE OF BIMOS TRANSISTORS

[75] Inventor: Chan-Jong Park, Seoul, Rep. of Korea

[73] Assignee: Samsung Electronics Co., Ltd., Suwon, Rep. of Korea

[21] Appl. No.: 725,737

[22] Filed: Oct. 4, 1996

[30] Foreign Application Priority Data

Oct. 4, 1995 [KR] Rep. of Korea ............. 95-33822

[51] Int. Cl.$^6$ ............................................. G11C 7/00
[52] U.S. Cl. ....................... 327/55; 327/210; 327/215; 327/219
[58] Field of Search ....................... 327/51–57, 208, 327/210, 215, 219, 220, 284, 285, 288, 544; 365/203–208, 210

[56] References Cited

U.S. PATENT DOCUMENTS

| | | | |
|---|---|---|---|
| 4,803,386 | 2/1989 | Kraus et al. | 327/55 |
| 4,947,376 | 8/1990 | Arimoto et al. | 327/51 |
| 5,091,885 | 2/1992 | Ohsawa | 365/203 |
| 5,323,345 | 6/1994 | Ohsawa | 327/51 |

*Primary Examiner*—Kenneth B. Wells
*Attorney, Agent, or Firm*—Jones & Volentine, L.L.P.

[57] ABSTRACT

A fast data transmission circuit for a semiconductor memory minimizes voltage variations of a data transmission line without the use of a separate data transmission voltage. The data transmission circuit includes a pair of input nodes, a data transmission line pair, a pair of sensing nodes, a pair of output nodes, and a control electrode. Prior to data transmission, the output nodes are pulled up to a high voltage state, the data transmission line pair is pulled down to a low voltage state, and the sensing nodes are held between the high and low voltage states. When the control pulse is applied to the control electrode, the sensing node voltage levels are transferred to the data transmission line pair by the sensing voltage transfer circuit. When one input node is pulled to a low voltage state, a corresponding one voltage level on one transmission line is changed, causing a corresponding change of voltage at one of the sensing nodes. The voltage difference at the sensing nodes causes a corresponding one of the output nodes to go to a low voltage state while the other output node remains at the high voltage state.

12 Claims, 4 Drawing Sheets

5,818,266

REFERENCE VOLTAGE GENERATOR MADE OF BIMOS TRANSISTORS

BACKGROUND OF THE INVENTION

The present invention relates to a semiconductor memory device, and more particularly, to a data transmission circuit by minimizing voltage variation of data transmission line without a use of data transmission voltage.

With the current advances in the state of the art, higher density and higher capacity integrated semiconductor memory devices are being produced. However, as the density and capacity of the integrated circuit continues to increase, it becomes increasingly important to reduce operating power of the semiconductor memory device. The conventional method of minimizing operating power consumption of the semiconductor memory device is to minimize the current consumption over the data transmission lines. This method is described in an article published by Hisakazu Kotani, et. al., in ISSCC 1994, pp 142–143, entitled "A 256 Mb DRAM with 100 MHZ Serial I/O ports for Storage of Moving Pictures". The above method, which employs a suppressed high differential transfer circuit SHF circuit, will briefly be described below with reference to FIG. 1.

FIG. 1 shows a circuit diagram of a data transmission circuit used for a conventional semiconductor memory device. In FIG. 1, a pair of data terminals of a data driver are connected to the data transmission line pair $D_1/D_2$ as input signals $IN_1$, and $IN_2$. These data input lines may be, for example, the sensing bit line pair of a sense amplifier of a semiconductor memory device. As shown in the dashed-line boxes in FIG. 1, each data transmission line $D_1$ and $D_2$ comprises a line resistance $R_1$ and $R_2$ and a pair of line capacitances $C_1$ & $C_3$ and $C_2$ & $C_4$.

The data transmission line pair $D_1/D_2$, through the data input lines $IN_1$ and $IN_2$, have been precharged in a logic "high" state, and an equalizing signal EQ is inputted also in the logic "high" state. Accordingly, the data transmission line pair $D_1/D_2$ are initially in an equalized state as an NMOS transistor $M_7$ is turned on by the equalizing signal EQ. In this equalized state, if the potential of either one of data transmission lines $D_1$ and $D_2$ and the equalizing signal EQ become a logic "low" level, and if a transmission pulse $C_1$ goes from the logic "low" state to the logic "high" state, the potential of a connection node $N_1$ at a common source of NMOS transistors $M_1$ and $M_2$, whose drains are connected to each of data transmission lines $D_1$ and $D_2$, is changed to the same level as first supply voltage, i.e., ground potential $V_{SS}$, through a drain-source channel of an NMOS transistor $M_5$. At this time, the potential of a connection node $N_2$ at a common source of NMOS transistors $M_3$ and $M_4$, whose drains are connected to each of data transmission lines $D_1$ and $D_2$, is set to the level of the internal supply voltage $V_{INT}$ supplied through a channel of an NMOS transistor $M_6$.

In the state mentioned above, assuming that one of the data input lines $IN_1$ and $IN_2$, e.g., $IN_2$, has been changed to the logic "low" state (the other data input line, $IN_1$ in this example, is provided with a complementary data signal and is maintained in the logic "high" level), NMOS transistors $M_1$ and $M_4$ whose gates are connected to data input line $IN_1$ are turned on, and NMOS transistors $M_2$ and $M_3$ whose gates are connected to the data input line $IN_2$ are turned off. Accordingly, the level of the data transmission line $D_1$ is changed to the level of the ground potential $V_{SS}$ as NMOS transistors $M_1$ and $M_3$ are turned on and turned off, respectively. Likewise, the level of the data transmission line $D_2$ is changed to the level of the internal supply voltage $V_{INT}$ as NMOS transistors $M_2$ and $M_4$ are turned off and turned on, respectively.

In this state, if the output control pulse $C_2$ for receiving data transmitted to the data transmission line pair $D_1/D_2$ is changed from the logic "high" state to the logic "low" state, PMOS transistor $M_8$ is turned on. In this circuit, PMOS transistor $M_8$ has its source connected to a second supply voltage, i.e., the supply voltage $V_{CC}$. As the PMOS transistor $M_8$ is turned on, PMOS transistor $M_9$ and $M_{10}$, whose gates are respectively connected to the data transmission lines $D_1$ and $D_2$, are each supplied with the supply voltage $V_{CC}$ at their sources. At this time, the potentials applied to the gates of PMOS transistors $M_9$ and $M_{10}$ are different and therefore, PMOS transistors $M_9$ and $M_{10}$ have different a channel conductances. In the above example, the potential level of the data transmission line $D_1$ is lower than that of the data transmission line $D_2$ and therefore, the channel conductance of the PMOS transistor $M_9$ becomes higher than that of the PMOS transistor $M_{10}$. Accordingly, the voltages at nodes $N_3$ and $N_4$ for the drains of PMOS transistors $M_9$ and $M_{10}$ are changed to the internal supply voltage level $V_{INT}$ and the ground potential $V_{SS}$, respectively. If the output node $N_3$ is pulled up to the logic "high" state, the NMOS transistor $M_{15}$ is turned on and the level of the node $N_4$ is thereby pulled down to the level of the ground potential $V_{SS}$. This means that if the transmission pulse $C_2$ is changed from the logic "high" state to the logic "low" state, the outputs of the inverters $INV_1$ and $INV_2$ may be pulled up to the logic "high" state and pulled down to the logic "low" state, respectively. In the configuration shown in FIG. 1, when the output control pulse $C_2$ is in the logic "high" state, NMOS transistors $M_{11}$, $M_{12}$ and $M_{13}$ are respectively turned on to precharge nodes $N_3$ and $N_4$ to the level of the ground potential $V_{SS}$, and to perform an equalizing operation.

The conventional data transmission circuit shown in FIG. 1 generates an internal supply voltage $V_{INT}$ only for the data transmission line in order to narrow a voltage variation of the data transmission line pair $D_1/D_2$. This additional supply voltage makes it very difficult to reduce the chip area and adds the problem if making sure that the line for the internal supply voltage $V_{INT}$ is properly distributed within the chip.

SUMMARY OF THE INVENTION

Accordingly, it is an object of the present invention to provide a semiconductor memory device capable of reducing the power consumption of a data transmission circuit by minimizing the voltage variation of the data transmission line without a use of a separate data transmission voltage.

It is another object of the present invention to provide a data transmission circuit capable of transmitting data in a low voltage level at a high speed.

To achieve these and other objects, the present invention provides a data transmission circuit for a semiconductor memory device, the data transmission circuit comprising; first and second input nodes for receiving first and second input signals, respectively; first and second data transmission lines; first and second output nodes; a control electrode; first and second sensing nodes; precharging circuit for precharging the data transmission line pair to a first supply voltage and varying the impedance of one of first and second data transmission lines of the data transmission line pair when the first and second input signals are complementary to each other; level detection voltage supplying circuit for applying a voltage from the first and second sensing nodes to the first and second data transmission lines, respectively, in response to a transmission pulse inputted to the control electrode; pull-up circuit for pulling up the first and second output nodes to a second supply voltage level; and a data detecting circuit comprising first and second MOS transistors, the sources of the first and second MOS transistors being connected respectively to the first and second output nodes, the drains of the first and second MOS transistors being connected respectively to the first and second sensing nodes, and the control electrodes of the MOS transistors being connected respectively to the second and first output nodes, the first and second MOS transistors acting to amplify voltage variation of the first and second sensing nodes.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings. In these drawings like reference symbols indicate the same or similar elements components.

DETAILED DESCRIPTION OF THE PREFERRED EMBODIMENT

Figure 1:
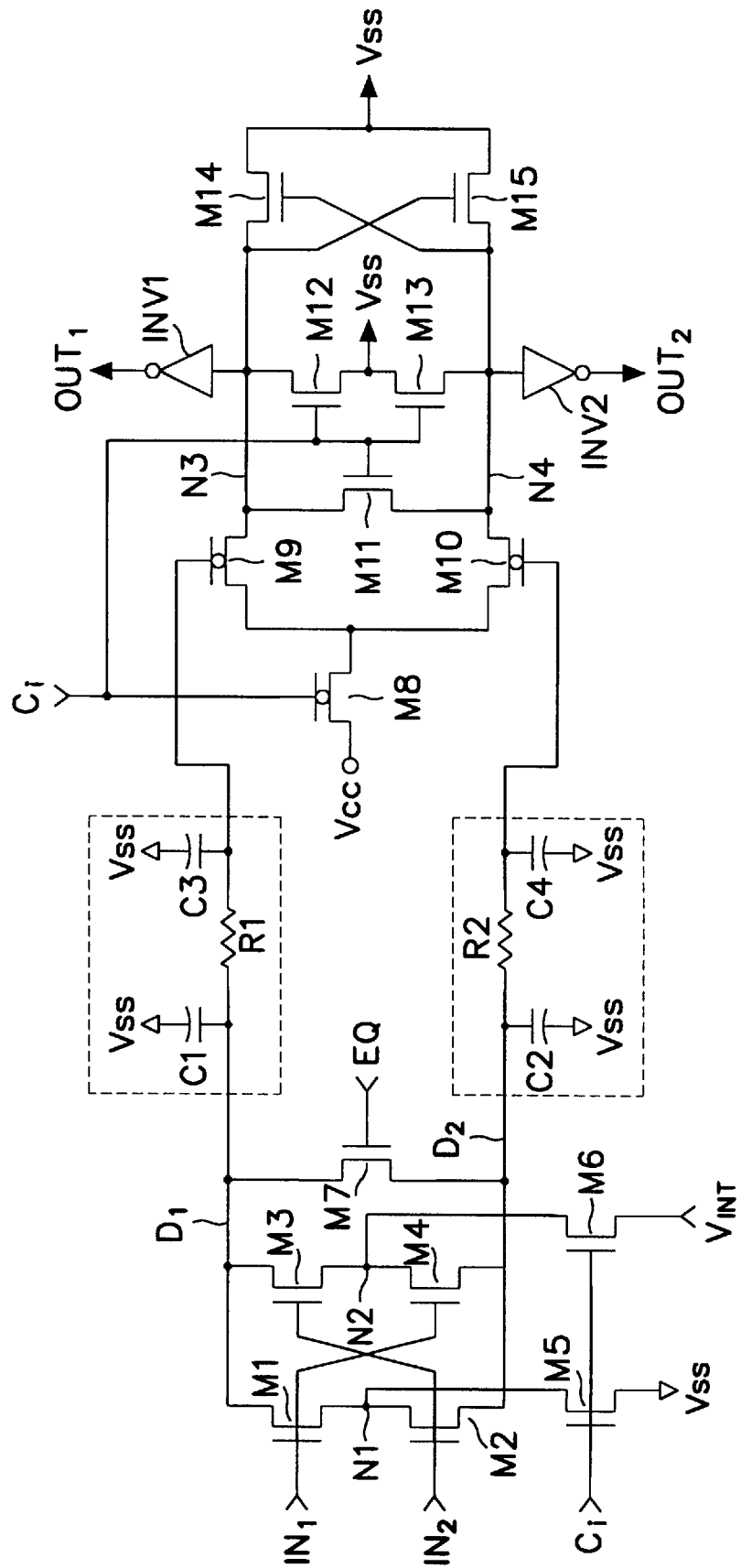
FIG. 1 is a circuit diagram illustrating a data transmission circuit used for a conventional memory device.
Figure 2:
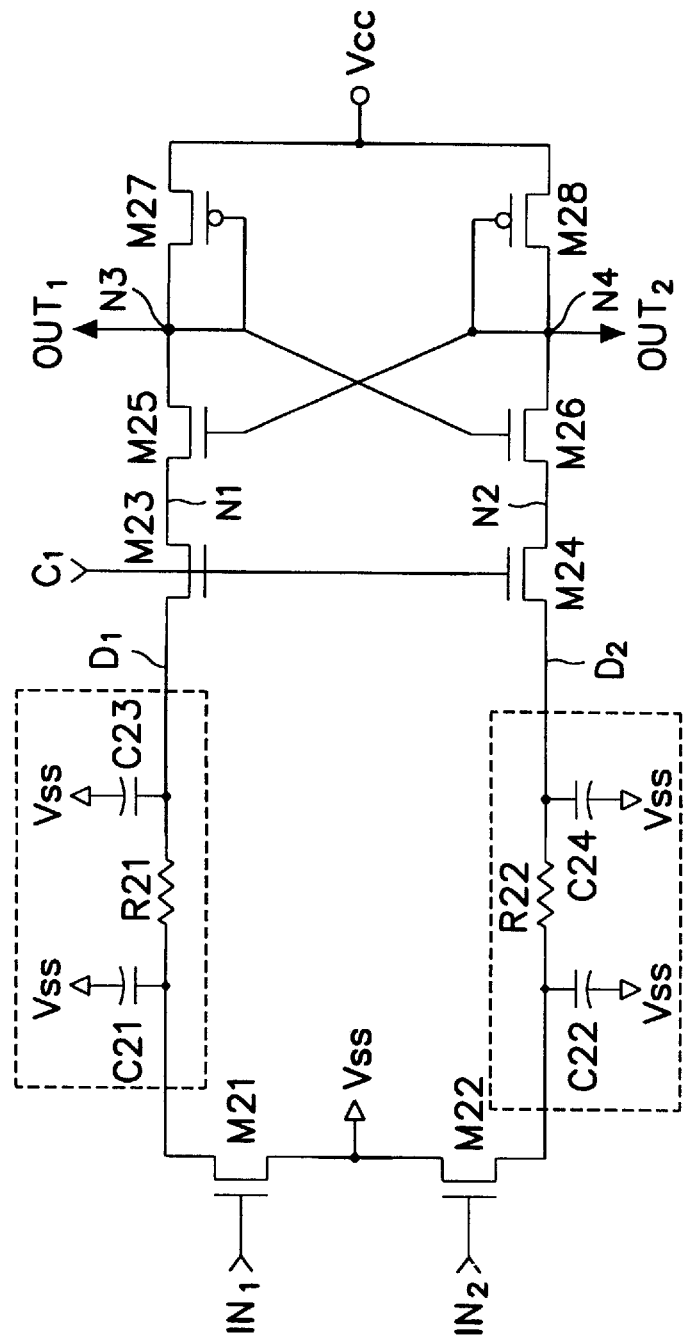
FIG. 2 is a circuit diagram illustrating a data transmission circuit for a semiconductor memory device according to a first preferred embodiment of the present invention.

FIG. 2 illustrates a circuit diagram of a data transmission circuit for a semiconductor memory device according to a first preferred embodiment of the present invention. The circuit shown in FIG. 2 acts to transmit data received as a pair of input signals $IN_1$ and $IN_2$ across a data transmission line pair $D_1/D_2$ in response to an input of one control pulse. This circuit does not use an additional transmission voltage for transmitting the data. As in the circuit of FIG. 1, each data transmission line $D_1$ and $D_2$ in the circuit of FIG. 2 comprises a line resistance $R_{21}$ and $R_{22}$ and a pair of line capacitances $C_{21}$ & $C_{23}$ and $C_{22}$ & $C_{24}$.

Figure 3:
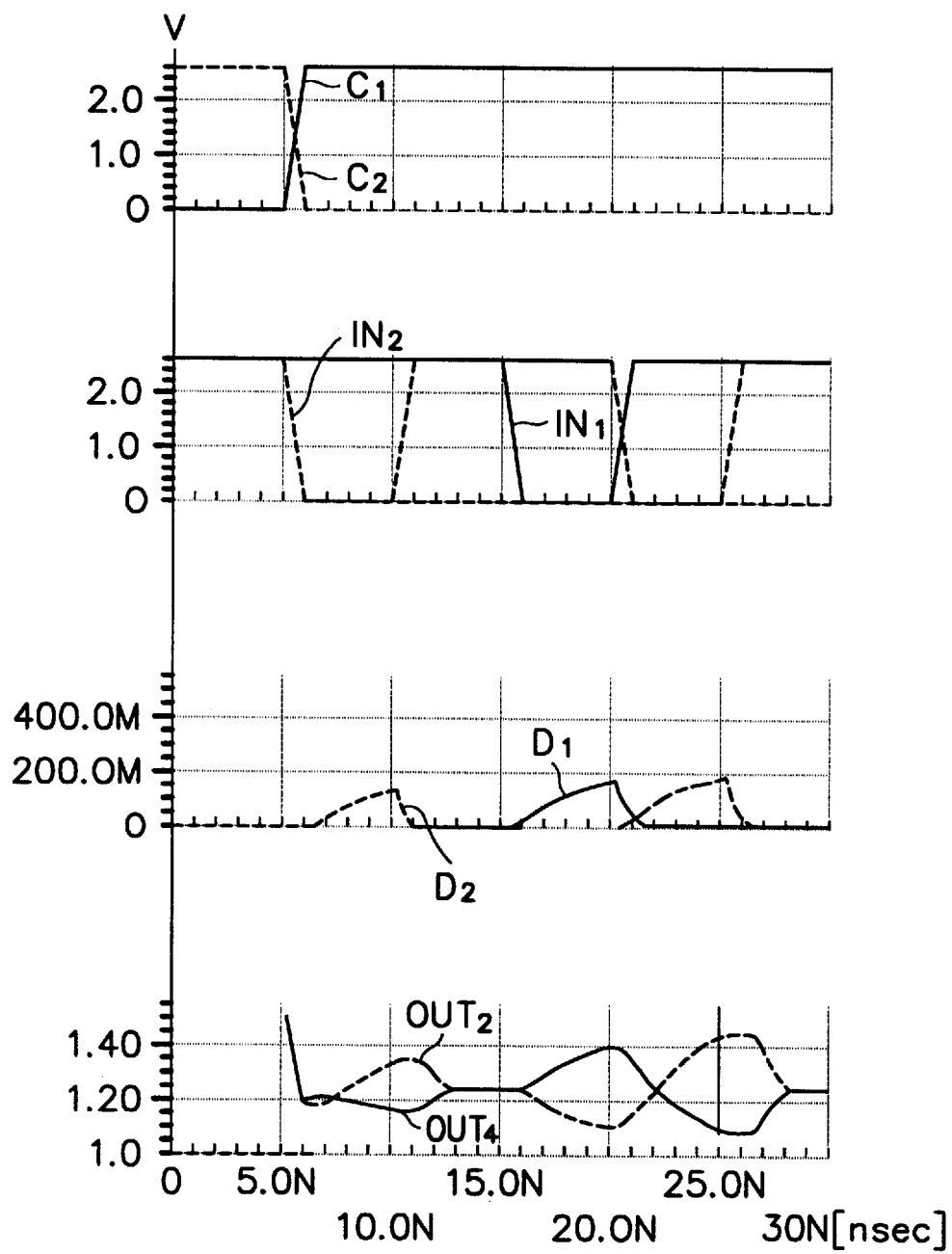
FIG. 3 is a operation timing diagram explaining the data transmission operation according to the first preferred embodiment of the present invention.

FIG. 3 is an operational timing diagram explaining an operation of a data transmission circuit in accordance with the first and second preferred embodiments of the present invention.

As shown in FIG. 3, if both of data input lines $IN_1$ and $IN_2$ of a data driver are inputted in a stand-by mode of a logic "high" state, signals of the logic "high" state of the data input pair $IN_1/IN_2$ are supplied to gates of NMOS transistors $M_{21}$ and $M_{22}$. The drains of NMOS transistors $M_{21}$ and $M_{22}$ are in turn connected to respective data transmission lines $D_1$ and $D_2$ corresponding to the data input lines $IN_1$ and $IN_2$, and their sources are connected in common to a first supply voltage, preferably the ground potential $V_{SS}$. Accordingly, if signal of the logic "high" state is inputted to both of the data input lines $IN_1$ and $IN_2$, NMOS transistors $M_{21}$ and $M_{22}$ are both turned on and the levels of the data transmission line pair $D_1/D_2$ are all precharged to the ground potential $V_{SS}$ level as shown in FIG. 3.

In this stand-by state, a transmission pulse $C_1$ is inputted in a second logic state, i.e., in the logic "low" state as shown in FIG. 3. If the transmission pulse $C_1$ is inputted in the logic "low" state, NMOS transistors $M_{23}$ and $M_{24}$ which are respectively connected to each one side of data transmission lines $D_1$ and $D_2$ are all turned off. At this time, the drain nodes of NMOS transistors $M_{23}$ and $M_{24}$, i.e., first and second sensing nodes $N_1$ and $N_2$, are precharged to half of the supply voltage $V_{CC}$ level. If a second supply voltage, preferably supply voltage $V_{CC}$, is applied to a circuit as shown in FIG. 2, PMOS transistors $M_{27}$ and $M_{28}$ which are diode-connected between the supply voltage $V_{CC}$ and output nodes $N_3$ and $N_4$ are turned on. When the PMOS transistors $M_{27}$ and $M_{28}$ are turned on, the levels of the output nodes $N_3$ and $N_4$ are precharged to the voltage $V_{CC}-V_{TP}$. As can be seen in FIG. 3, NMOS transistors $M_{25}$ and $M_{26}$, whose gates are respectively connected to output nodes $N_3$ and $N_4$, are turned on thus maintaining first and second sensing nodes $N_1$ and $N_2$ in a state precharged to the level of the $V_{CC}-V_{TP}-V_{TN}$. In this formula $V_{TP}$ refers to as a threshold voltage of PMOS transistors $M_{27}$ and $M_{28}$, and $V_{TN}$ refers to as a threshold voltage of NMOS transistors $M_{25}$ and $M_{25}$.

In this stand-by state, if either one of the data input lines $IN_1$ and $D_2$ $IN_2$ is changed from the logic "high" state to the logic "low" state, for example, if the data input line $IN_2$ goes to the logic "low" level as shown in FIG. 3, the NMOS transistor $M_{21}$ maintains the turned-on state, and the NMOS transistor $M_{22}$ is turned off. In such a state, the transmission pulse $C_1$ is also changed from the logic "low" state to the logic "high" state as shown in FIG. 3, NMOS transistors $M_{23}$ and $M_{24}$ are then turned on in response to the transmission pulse $C_1$ of the logic "high" state. If the NMOS transistors $M_{23}$ and $M_{24}$ are turned on, the first and second sensing nodes $N_1$ and $N_2$ are then connected to the respective first and second data transmission lines $D_1$ and $D_2$ of the data transmission line pair $D_1/D_2$. As a result, if the transmission pulse $C_1$ is changed from the logic "low" state to the logic "high" state, the supply voltage $V_{CC}$ flows into the respective data transmission line $D_1$ and $D_2$ through a source-drain channel of one of the first and second PMOS transistors $M_{23}$ and $M_{24}$.

In the example described above, the first NMOS transistor $M_{21}$ connected to the data transmission line pair $D_1/D_2$ has been turned on, and the second NMOS transistor $M_{22}$ has been turned off. Therefore, the potential of the respective data transmission lines $D_1$ and $D_2$ is changed after electrical current is allowed to flow through NMOS transistors $M_{23}$ and $M_{24}$ and then a given time period has lapsed. In other words, a given potential difference occurs between data transmission lines $D_1$ and $D_2$.

In this example, the potential of the data transmission line $D_1$ is discharged to the ground potential $V_{SS}$ level through a drain-source channel of the turned-on NMOS transistor $M_{21}$, and thereby it is pulled-down to the ground potential $V_{SS}$ level as shown in FIG. 3. Likewise, the data transmission line $D_2$ has a given potential level which is determined by a charge amount flowed through the second NMOS transistor $M_{24}$, its line capacitances $C_{22}$ and $C_{24}$, and its line resistance $R_2$ as shown in FIG. 3.

If the potential of the data transmission lines pair $D_1/D_2$ is changed as shown in FIG. 3 when the transmission pulse $C_1$ is enabled to the logic "high" state, a difference in the channel conductance of the NMOS transistors $M_{23}$ and $M_{24}$ occurs and the potential of the first and second sensing nodes $N_1$ and $N_2$ is thereby changed. This means that the level of the drain of the NMOS transistor $M_{23}$ is pulled down to the logic "low" state by a state precharged to the ground potential $V_{SS}$ level and the level of the drain of the NMOS transistor $M_{24}$ is maintained in the level of the voltage $V_{CC}$—$V_{TP}$—$V_{TN}$ by the data transmission line $D_2$ which has a given potential level as the NMOS transistor $M_{22}$ is turned off. If the level of the first sensing node $N_1$ is pulled down as stated above, the potential of the first output node $N_3$ to which the drain of the NMOS transistor $M_{25}$ is connected is pulled down into the logic "low" level, and the NMOS transistor $M_{26}$ whose control electrode is connected to the first output node $N_3$ is turned off. Accordingly, the second output node $N_4$ maintains the logic "high" state by the PMOS transistor $M_{28}$ which is diode-connected between the supply voltage $V_{CC}$ and the second output node $N_4$, thereby being matched with the signal input state of the data transmission line pair $D_1/D_2$ to change output state thereof as shown in FIG. 3 and transmit the signal.

Accordingly, the data transmission circuit having the configuration as shown in FIG. 2 can transmit data without a use of additional data transmission voltage. In the example described above, the data transmission line $D_2$ of the data transmission line pair $D_1/D_2$ is changed from the logic "high" state to the logic "low" state. Since the circuit is a mirror image for $D_1$ and $D_2$, operation would be similar, albeit reversed upon an input of the complementary data. Results of the output nodes $N_3$ and $N_4$ are received in states of the supply voltage $V_{CC}$ and ground potential through the same procedure as the above.

Figure 4:
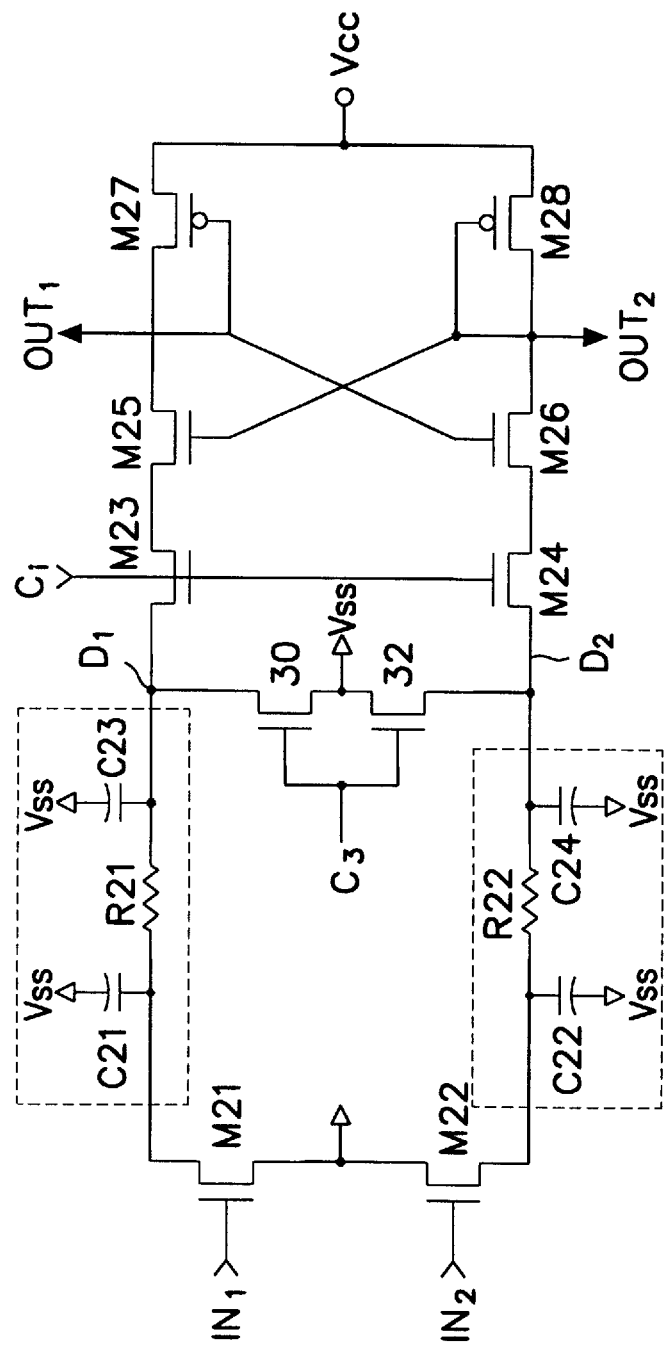
FIG. 4 is a circuit diagram illustrating a data transmission circuit for a semiconductor memory device in accordance with a second embodiment of the present invention.

FIG. 4 illustrates the data transmission circuit of the semiconductor memory device in accordance with the second preferred embodiment of the present invention. This second preferred embodiment has an additional circuit for precharging the data transmission line pair $D_1/D_2$ shown in FIG. 2 to the ground potential $V_{SS}$. In FIG. 2, in order to precharge the first and second data transmission lines $D_1$ and $D_2$ to the ground voltage $V_{SS}$ level, both data and complementary data which are received to the data line pair $D_1/D_2$ receiving data from the outside should be inputted in the logic "high" state so that NMOS transistors $M_{21}$ and $M_{22}$ can be turned on. The circuit shown in FIG. 4 aims to resolve such a limitation.

In FIG. 4, the precharge circuit connected between the data transmission lines $D_1$ and $D_2$ comprises two NMOS transistors $M_{30}$ and $M_{32}$ whose sources are respectively connected to the ground potential $V_{SS}$ and whose drains are respectively connected to the first and second data transmission lines $D_1$ and $D_2$, inputting precharge pulse $C_3$ at their gates.

The data transmission circuit having the precharge circuit operates in the same manner as the circuit shown in FIG. 2, and performs an additional operation for precharging the data transmission line pair $D_1/D_2$ to the ground potential $V_{SS}$ level when the precharge control pulse $C_3$ is inputted in the logic "high" state. This precharge control pulse $C_3$ has a phase opposite to that of the transmission pulse $C_1$ as can be seen in the timing diagram shown in FIG. 3.

As is apparent from the foregoing, the present invention can reduce the power consumption by the data transmission line by minimizing the voltage variation of the data line without a use of the additional power supply for transmitting data, and also efficiently obtain the high integration of the device by reducing the size of the data transmission circuit.

Therefore, it should be understood that the present invention is not limited to the particular embodiment disclosed herein as the best mode contemplated for carrying out the present invention, but rather that the present invention is not limited to the specific embodiment described in this specification except as defined in the appended claims.

What is claimed is:

1. A data transmission circuit for a semiconductor memory device, the data transmission circuit comprising:

first and second input nodes for receiving first and second input signals, respectively;

first and second data transmission lines;

first and second output nodes;

a control electrode;

first and second sensing nodes;

precharging circuit for precharging the first and second data transmission lines to a first supply voltage and for varying the voltage potential of one of the first and second data transmission lines when the first and second input signals are complementary to each other;

sensing node voltage level supplying circuit for applying a voltage from the first and second sensing nodes to the first and second data transmission lines, respectively, in response to a transmission pulse inputted to the control electrode;

pull-up circuit for pulling up the first and second output nodes to a second supply voltage level; and a data signal outputting circuit comprising first and second MOS transistors, the sources of the first and second MOS transistors being connected respectively to the first and second output nodes, the drains of the first and second MOS transistors being connected respectively to the first and second sensing nodes, and the control electrodes of the MOS transistors being connected respectively to the second and first output nodes, the first and second MOS transistors acting to amplify voltage variation of the first and second sensing nodes.

2. A data transmission circuit as recited in claim 1, wherein the precharging circuit comprises first and second NMOS transistors, the sources of the first and second NMOS transistors being connected in common to a first supply voltage, the drains of the first and second NMOS transistors being connected respectively to the first and second data transmission lines, and the control electrodes of the first and second NMOS transistors being connected respectively to the first and second input nodes.

3. A data transmission circuit as recited in claim 1, wherein the sensing node voltage level supplying circuit comprises first and second NMOS transistors, the source-drain channels of the first and second NMOS transistors being connected respectively between the first and second data transmission lines and the first and second sensing nodes, the first and second NMOS transistors respectively supplying voltages from the first and second sensing nodes to the first and second data transmission lines as a transmission pulse is enabled and inputted through the gate terminals of the first and second NMOS transistors.

4. A data transmission circuit as claimed in claim 3, wherein the pull-up circuit comprises first and second PMOS transistors, the first and second PMOS transistor being connected between the second supply voltage and the first and second output nodes.

5. A data transmission circuit as recited in claim 1, wherein the first supply voltage is ground potential and the second supply voltage is operating power.

6. A data transmission circuit for a semiconductor memory, the data transmission circuit comprising:

first and second input nodes for receiving first and second input signals, respectively;

first and second data transmission lines;

first and second output nodes;

a control electrode;

first and second sensing nodes;

precharge circuit for precharging the first and second data transmission lines to a first supply voltage in response to an inputted control pulse;

voltage potential varying circuit for varying the voltage potential of either one of the first and second data transmission lines when the first and second input signals are complementary to each other;

sensing node voltage level supplying circuit for supplying a voltage of the first and second sensing nodes to the first and second data transmission lines of the data transmission line pair in response to a transmission pulse inputted through the control electrode;

pull-up circuit for pulling up the output nodes to a level of a second supply voltage; and data signal outputting circuit comprising first and second MOS transistors, the sources of the first and second MOS transistors being connected respectively to the first and second output nodes, the drains of the first and second MOS transistors being connected respectively to the first and second sensing nodes, and control electrodes of the first and second MOS transistors being connected respectively to the second and first output nodes, the first and second MOS transistors acting to amplify voltage variation of the first and second sensing nodes.

7. A data transmission circuit as recited in claim 6, wherein the voltage potential varying circuit comprises first and second NMOS transistors, the sources of the first and second NMOS transistors being connected in common to a first supply voltage, the drains of the first and second NMOS transistors being connected respectively to the first and second data transmission lines, and control electrodes of the first and second NMOS transistors being connected respectively to the first and second input nodes.

8. A data transmission circuit as recited in claim 6, wherein the transmission pulse is a pulse that is changed to an enabled state when the control pulse is disabled.

9. A data transmission circuit as recited in claim 7, wherein the precharge circuit comprises third and fourth NMOS transistors, the sources of the third and fourth NMOS transistors being connected in common to the first supply voltage, the drains of the third and fourth NMOS transistors being connected respectively to the first and second data transmission lines, and the control electrodes of the third and fourth NMOS transistors being connected to the control pulse.

10. A data transmission circuit as recited in claim 9, wherein the sensing node voltage level supplying circuit comprises fifth and sixth NMOS transistors, the source-drain channels of the fifth and sixth NMOS transistors being connected respectively between the first and second data transmission lines and the first and second sensing nodes, the fifth and sixth NMOS transistors acting to supply the voltage of the two sensing nodes to the first and second data transmission lines as a transmission pulse inputted through the control electrode is enabled.

11. A data transmission circuit as claimed in claim 8, wherein the pull-up means comprises first and second PMOS transistors, the first and second PMOS transistors being diode-connected between the second supply voltage and the first and second output nodes, respectively.

12. A data transmission circuit as recited in claim 6, wherein the first supply voltage is ground potential, and the second supply voltage is operating power.

* * * * *